United States Patent
Noda et al.

(10) Patent No.: US 8,284,814 B2
(45) Date of Patent: Oct. 9, 2012

(54) PHOTONIC CRYSTAL LASER

(75) Inventors: Susumu Noda, Uji (JP); Yoshitaka Kurosaka, Kyoto (JP); Kyosuke Sakai, Kyoto (JP); Eiji Miyai, Kyoto (JP); Dai Ohnishi, Otsu (JP); Wataru Kunishi, Kyoto (JP)

(73) Assignees: Japan Science and Technology Agency, Kawaguchi-Shi (JP); Rohm Co., Ltd., Kyoto-Shi (JP)

( * ) Notice: Subject to any disclaimer, the term of this patent is extended or adjusted under 35 U.S.C. 154(b) by 291 days.

(21) Appl. No.: 12/230,494

(22) Filed: Aug. 29, 2008

(65) Prior Publication Data

US 2009/0074024 A1    Mar. 19, 2009

(30) Foreign Application Priority Data

Aug. 31, 2007    (JP) .................................. 2007-226255

(51) Int. Cl.
*H01S 3/08*    (2006.01)
(52) U.S. Cl. ......................................................... 372/96
(58) Field of Classification Search .................. 372/96
See application file for complete search history.

(56) References Cited

U.S. PATENT DOCUMENTS

| | | | |
|---|---|---|---|
| 3,876,842 A | | 4/1975 | Bouwhuis |
| 6,154,480 A | * | 11/2000 | Magnusson et al. ............ 372/96 |
| 6,829,281 B2 | * | 12/2004 | Deng et al. ...................... 372/96 |
| 2001/0026857 A1 | * | 10/2001 | Kinoshita ...................... 428/105 |
| 2005/0094956 A1 | * | 5/2005 | Parker et al. ................... 385/129 |
| 2007/0121694 A1 | * | 5/2007 | Okamoto ................. 372/50.124 |

FOREIGN PATENT DOCUMENTS

| | | |
|---|---|---|
| JP | A-2000-332351 | 11/2000 |
| WO | WO03005513 A1 * | 1/2003 |
| WO | WO 2006117863 A1 * | 11/2006 |

OTHER PUBLICATIONS

Fan et al., "Analysis of Guided Resonances in Photonic Crystal Slabs", 2002, Phys. Rev. B, 65, 235112, 1-8.*
Ito et al.; "Semiconductor Laser Basics and Applications;" Apr. 25, 1989; pp. 305-306; Baifukan Co., Ltd.; Tokyo.
Miyai et al.; "Possibility of lasing operation at non-Γ-point of photonic-crystal laser;" *Japan Society of Applied Physics*; 2006; pp. 968.

* cited by examiner

*Primary Examiner* — Tod T Van Roy
*Assistant Examiner* — Joshua King
(74) *Attorney, Agent, or Firm* — Oliff & Berridge, PLC

(57) ABSTRACT

A laser capable of emitting multiple laser beams is provided. A two-dimensional photonic crystal laser according to the present invention has a laminated structure including an active layer, a first photonic crystal layer having a periodic distribution of refractive index with a first period, and a second photonic crystal layer having a periodic distribution of refractive index with a second period that differs from the first period. This two-dimensional photonic crystal laser can emit a main beam traveling in a direction perpendicular to the two-dimensional photonic crystals and side beams each traveling in a direction inclined with respect to the main beam. These beams can be used, for example, in a recording/reproducing device by means of an optical disk, the main beam being used for recording/reproducing information and the side beams for following up the track.

14 Claims, 13 Drawing Sheets

(a) 1ST TWO-DIMENSIONAL PHOTONIC CRYSTAL LAYER 121

(b) 2ND TWO-DIMENSIONAL PHOTONIC CRYSTAL LAYER 122

(a) 1ST RESIST 231

(b) 2ND RESIST 232

(c) 3RD RESIST 233

(a) USING TWO-DIMENSIONAL PHOTONIC CRYSTAL LASER 31 ACCORDING TO THE PRESENT INVENTION (b) PRIOR ART (a) POSITION NOT DISPLACED (b) POSITION DISPLACED (a) 1ST PHOTONIC CRYSTAL LAYER 621  (b) 2ND PHOTONIC CRYSTAL LAYER 622

(a) 1ST PHOTONIC CRYSTAL LAYER 721  (b) 2ND PHOTONIC CRYSTAL LAYER 722

PHOTONIC CRYSTAL LASER

TECHNICAL FIELD

The present invention relates to a laser capable of emitting multiple beams. Such a laser can be used, for example, as a light source for recording or reproducing information by means of an optical disk.

BACKGROUND ART

In a device for recording information onto an optical disk or reproducing information from an optical disk, when a single recording/reproducing laser beam is delivered onto a track in which information is to be recorded or has been recorded, two position-detecting laser beams that are symmetrical with respect to the recording/reproducing laser beam are also delivered onto the same track. These beams are generated by splitting a single laser beam from one light source (i.e. a laser) with a diffraction grating (for example, refer to Patent Document 1 and Non-Patent Document 1).

A single laser light source generally emits a single laser beam in a specific direction. Therefore, if multiple laser beams are required, it is necessary to use a diffraction grating or similar dispersing element to split one laser beam emitted from the light source, or provide two or more light sources.

Accordingly, if multiple laser beams can be generated from a single element, the diffraction grating will no longer be necessary, so that the device will be downsized and its production cost will be decreased.

On the other hand, it is known that a laser using a two-dimensional photonic crystal normally emits a single laser beam in a direction perpendicular to the two-dimensional photonic crystal (for example, refer to Patent Document 2) yet allows the emitting direction of the laser beam to be controlled by appropriately shaping the holes created in the two-dimensional photonic crystal (refer to Non-Patent Document 2). This is because an appropriately shaped hole improves the light-confining property (which is represented by a $Q_{//}$ value) with respect to the direction parallel to the two-dimensional photonic crystal in a photonic band in which the group velocity becomes zero when the component $k_{//}$ of the wave number vector parallel to the two-dimensional photonic crystal is at a non-Γ point, i.e. when $k_{//}$ is not zero.

However, Non-Patent Document 2 makes no mention as to the number of laser beams emitted from the laser and thereby offers little help in the development of a device that requires multiple laser beams (e.g. the aforementioned optical disk recording/reproducing device).

Patent Document 1: U.S. Pat. No. 3,876,842
Patent Document 2: Japanese Unexamined Patent Application Publication No. 2000-332351
Non-Patent Document 1: Ryoichi Ito and Michiharu Nakamura, *Handoutai Rehza [Kiso To Ouyou]* (*Semiconductor Laser [Basics and Applications]*), pp. 305-306, published Apr. 25, 1989, Baifukan Co., Ltd, Tokyo
Non-Patent Document 2: Eiji Miyai et al., "Fotonikku Kesshou Men Hakkou Rehza No Gamma-Ten Igai Deno Hasshin No Kanousei No Kentou (Study on the Possibility of the Oscillation of a Photonic Crystal Surface Emitting Laser at a Point other than the Γ Point)", *Preprints of 67th Meeting of Japan Society of Applied Physics* (Issued Aug. 29, 2006), Part 3, p. 968, Japan Society of Applied Physics

DISCLOSURE OF THE INVENTION

Problem to be Solved by the Invention

A problem to be solved by the present invention is to provide a laser capable of emitting multiple laser beams.

The present invention also provides a laser in which the emitting direction of the laser beams is controllable.

Means for Solving the Problems

To solve the aforementioned problem, a photonic crystal laser characterized by comprising:

an active layer for generating light of a predetermined wave number range upon the injection of an electric current;

a first photonic crystal layer for forming a standing wave of light having a first wave number within the aforementioned wave number range, among the light generated in the active layer; and a second photonic crystal layer for forming a standing wave of light having a second wave number within the aforementioned wave number range and different from the first wave number, among the light generated in the active layer.

The reason why the photonic crystal laser according to the present invention can emit multiple laser beams is hereinafter explained.

Conventional photonic crystal lasers have one active layer and one photonic crystal layer. Among the light generated within the active layer, light having a specific wave number, which depends on the periodic structure of the photonic crystal layer, forms a standing wave within the photonic crystal layer. Thus, only this light having the specific wave number is amplified and causes a laser oscillation. In the case of the photonic crystal laser according to the present invention, the wave number of the standing wave formed within the first photonic crystal layer (the first wave number) differs from that of the standing wave formed within the second photonic crystal layer (the second wave number). Therefore, a spatial beat results from the superposition of these two light. This causes a laser oscillation at a non-Γ point (where $k_{//}$ is not zero), whereby a beam that travels in a direction inclined with respect to a perpendicular to the photonic crystal layer is obtained. If the standing waves are formed in one direction within the photonic crystals, two beams that are respectively inclined forwards and backwards along that direction will result. If the standing waves are formed in two or more directions, two inclined beams will result in each of these directions. Thus, the photonic crystal laser according to the present invention can emit multiple laser beams. Increasing the difference between the first and second wave numbers increases the inclination angle from the perpendicular to the photonic crystal layer.

If a laser oscillation occurs at the Γ point (where the wave number component k// is zero), a beam that travels in the direction perpendicular to the photonic crystal layer is also obtained in addition to the inclined beams. In the following discussion, when both the perpendicular beam and inclined beams are present, the perpendicular beam and inclined beams will be referred to as the "main beam" and "side beams", respectively.

Both the first and second photonic crystal layers may be provided on one side (the same side) of the active layer. However, it is more preferable to provide the first photonic crystal layer on one side of the active layer and the second photonic crystal layer on the other side of the active layer, since a higher degree of structural symmetry leads to a higher efficiency of laser oscillation. In the case where both the first and second photonic crystal layers are provided on one side of the active layer, it is possible to create these two layers as a single component by, for example, providing the first photonic crystal layer on one side of a plate member and the second photonic crystal layer on the other side of the same plate member.

In the photonic crystal laser according to the present invention, the first and second photonic crystal layers may be configured so that the first photonic crystal layer has a periodic distribution of refractive index with a first period, while the second photonic crystal layer has a periodic distribution of refractive index with a second period that differs from the first period. With this configuration, a standing wave having a first wave number corresponding to the first period is formed within the first photonic crystal layer, while a standing wave having a second wave number, which corresponds to the second period and differs from the first wave number, is formed within the second photonic crystal layer.

Each of the first and second photonic crystal layers thus configured can be created by using a two-dimensional photonic crystal including a plate member in which modified refractive index portions whose refractive index differs from that of the plate member are periodically arranged. For example, the modified refractive index portions in the first photonic crystal layer may be arranged on the lattice points of an orthogonal (square or rectangular) lattice or triangular lattice, and the modified refractive index portions in the second photonic crystal layer may be arranged on the same type of lattice as the modified refractive index portions in the first photonic crystal layer.

The first and second photonic crystal layers may be configured so that one of these two layers has its modified refractive index portions arranged in a square lattice pattern while the other layer has its modified refractive index portions arranged in a rectangular lattice pattern, the period of this rectangular lattice in a first direction being equal to the period of the square lattice, and the period of the same rectangular lattice in a second direction perpendicular to the first direction being different from the period of the square lattice. With this configuration, no side beam is emitted in the first direction in which the first and second photonic crystal layers have the same period, while two side beams symmetrical with respect to the main beam are emitted in pairs in the second direction in which the two layers have different periods. The main beam and two side beams in this mode are suitable as a light source for the previously mentioned optical disk recording/reproducing device.

In the case where both the first and second photonic crystal layers have their modified refractive index portions arranged in a rectangular lattice pattern, it is possible to similarly obtain one main beam and two side beams by designing the two layers so that they have different periods in one direction and the same period in other directions. However, in order to achieve the highest possible degree of structural symmetry, it is preferable that, as in the previous case, one of the two photonic crystal layers has its modified refractive index portions arranged in a square lattice pattern.

If both the first and second photonic crystal layers have their modified refractive index portions arranged in a square lattice pattern, it is possible to obtain one main beam surrounded by a total of four side beams emitted at angular intervals of 90 degrees. If both the first and second photonic crystal layers have their modified refractive index portions arranged in a triangular lattice pattern, it is possible to obtain one main beam surrounded by a total of three side beams emitted at angular intervals of 120 degrees.

It is possible that: the first photonic crystal layer is a plate member having a first rod group formed by rods having a refractive index different from that of the plate member, the rods being embedded in the plate member in a pattern parallel to each other and parallel to the plate member; the second photonic crystal layer is a plate member having a second rod group formed by rods having a refractive index different from that of the plate member, the rods being embedded in the plate member in a pattern parallel to each other, parallel to the plate member and perpendicular to the rods of the first rod group; and at least either the first or second rod group has a defect created in the periodic structure thereof.

An operation of a laser using the photonic crystal layers having these rods is now explained. This explanation takes, as an example, the case where a defect is present in the second rod group. (The explanation also applies to the case where a defect is present in the first rod group.) Within the second photonic crystal layer, a standing wave is formed with a wave number component $k_{2\perp}$ in the direction perpendicular to the rods and a wave number component $k_{2//}$ in the direction parallel to the rods, $k_{2//}$ being adequately smaller than $k_{2\perp}$. The standing wave having this wave number component $k_{2//}$ and a standing wave having a wave number $k_{1\perp}(\neq k_{2//})$ formed in the direction perpendicular to the rods within the first photonic crystal layer produce a main beam and two side beams inclined with respect to the main beam.

A photonic crystal laser in which the emitting direction of multiple laser beams is controllable is hereinafter described. (This laser is hereinafter called the "emitting direction variable photonic crystal laser.") In the previously described photonic crystal laser according to the present invention, the emitting direction variable photonic crystal laser according to the present invention is characterized in that:

the second period changes according to the position in the second photonic crystal layer; and the electric current is injected into only a portion of the active layer, the injection point being controllable.

An operation of the emitting direction variable photonic crystal laser according to the present invention is described next. Injecting an electric current into only a portion ("current injection portion") of the active layer causes a standing wave having a different wave number to be formed and amplified within each of the first and second photonic crystal layers at a portion facing the current injection portion. These light waves are superposed with each other, causing a spatial beat, so that oblique beams are generated as explained earlier. In this process, since the second period changes according to the position in the second photonic crystal layer, the second wave number can be changed by shifting the position of the current injection portion. As explained earlier, the emitting direction of the oblique beams changes depending on the difference between the first and second wave numbers. Therefore, it is possible to control the emitting direction of the oblique beams by changing the second wave number in the previously described manner.

In the emitting direction variable photonic crystal laser according to the present invention, the second photonic crystal layer may have a plurality of areas having different second periods (the modified period areas). In this case, the means for injecting an electric current into the active layer (the current injection means) may be a pair of electrodes between which the active layer, the first photonic crystal layer and the second photonic crystal layer are sandwiched, one of the two electrodes being divided into a plurality of electrode segments for each of the modified period areas. In this mode of the emitting direction variable photonic crystal laser, it is possible to select one of the electrode segments as an electrode for the injection of electric current so as to select a specific modified period area in which a standing wave is to be formed within the second photonic crystal layer, and thereby set the second wave number at a value specific to the selected area. Thus, the emitting direction of the oblique beams can be controlled.

In an example of the second photonic crystal layer having a plurality of modified period areas, the modified period areas are arranged in a rectangular lattice pattern with lattice points arrayed in two directions intersecting each other in the rectangular lattice, in which (1) the lattice-point interval in one direction varies from one modified period area to another, or (2) the lattice-point intervals in both directions vary from one modified period area to another.

In the emitting direction variable photonic crystal laser according to the present invention, the second photonic crystal layer may have the second period continuously varying within the second photonic crystal layer. In this case, the current injection means may preferably include a pair of electrodes between which the active layer, the first photonic crystal layer and the second photonic crystal layer are sandwiched, one of the two electrodes being divided into a plurality of electrode segments. The use of these electrode segments enables the injection point of the current in the active layer to be controlled by selecting one electrode segment or a plurality of neighboring electrode segments as an electrode for injecting the current into the active layer. Controlling the current injection point in this manner makes it possible to select a specific modified period area in which a standing wave is to be formed within the second photonic crystal layer, and thereby set the second wave number at a value specific to the selected area. Thus, the emitting direction of the oblique beams can be controlled.

In an example of the second photonic crystal layer with a continuously varying second period, the modified period areas are arranged in a rectangular lattice pattern in which (1) the lattice-point interval in one direction of the rectangular lattice continuously varies, or (2) the lattice-point intervals in two directions of the rectangular lattice continuously vary.

Effects of the Invention

With the photonic crystal laser according to the present invention, a plurality of laser beams each traveling in a direction inclined with respect to a perpendicular to the photonic crystal layer can be obtained.

In the case where a laser oscillation occurs at the Γ point (where the wave number component kit is zero), it is possible to generate a main beam traveling in the direction perpendicular to the photonic crystal layers and side beams each traveling in a direction inclined with respect to the main beam by means of a single elemental device without using a diffraction grating or similar element. Such a laser is suitable, for example, for generating a recording/reproducing laser light (main beam) and position-detecting laser light (side beams) in recording information onto an optical disk or reproducing information from an optical disk.

The emitting direction variable photonic crystal laser according to the present invention allows the emitting direction of the side beams to be controlled by changing the injection point of an electric current into the active layer. This emitting direction control can be achieved by only a single laser element without using any mechanical scanning system. Therefore, the emitting direction variable photonic crystal laser according to the present invention is suitable for micro-sized devices that require a laser-beam scan. Examples of such micro-sized devices include a capsulated medical laser knife (i.e. a laser knife enclosed in a capsule to be swallowed by a patient for the purpose of performing medical treatment by scanning the inside of the digestive system with a laser light emitted from the capsule) and a micro-sized display device.

BEST MODES FOR CARRYING OUT THE INVENTION (1) Configuration of an Embodiment of the Photonic Crystal Laser According to the Present Invention An embodiment of the photonic crystal laser according to the present invention (a two-dimensional photonic crystal laser) is described using FIGS. 1 to 14. FIG. 1 is a vertical sectional view of the two-dimensional photonic crystal laser 10 in the present embodiment. This two-dimensional photonic crystal laser 10 has an active layer 11, which emits light of a predetermined wavelength range when electrons and positive holes are injected into it. On one side (the upper side in the figure) of the active layer 11, a first photonic crystal layer 121 is provided, with a first carrier-blocking layer 131 in between. On the other side (the lower side in FIG. 1) of the active layer 11, a second photonic crystal layer 122 is provided, with a second carrier-blocking layer 132 in between. The configurations of these photonic crystal layers will be described later. Located on the upper side of the first photonic crystal layer 121 is a first cladding layer 141 made of a p-type semiconductor, and located beneath the lower side of the second photonic crystal layer 122 is a second cladding layer 142 made of an n-type semiconductor. The upper side of the first cladding layer 141 is covered by a first contact layer 151, and the lower side of the second cladding layer 142 is covered by a second contact layer 152. The first contact layer 151 and second contact layer 152 have a first electrode 161 and second electrode 162 on their surfaces, respectively.

FIG. 2 shows perspective views of the first photonic crystal layer 121 and second photonic crystal layer 122. The first photonic crystal layer 121 comprises a first plate member 121A made of a dielectric material in which first air holes 121B are arrayed in a square lattice pattern. The period of this square lattice is $a_1$. The second photonic crystal layer 122 comprises a second plate member 122A made of the same material as that of the first plate member 121A, in which second air holes 122B identical in shape to the first air hole 121B are arrayed in a rectangular lattice pattern. The period of this rectangular lattice in one direction (y-axis direction) is $a_1$, which equals that of the aforementioned square lattice, whereas the period in the perpendicular direction (i.e. the x-axis direction) is $a_2 (\neq a_1)$. The period $a_2$ may be larger or smaller than $a_1$. The square lattice and rectangular lattice have their x-axes and y-axes oriented in the same directions.

An example of the material for the active layer 11 is InGaAs. The material for the plate member of both the first photonic crystal layer 121 and second photonic crystal 122 may be GaAs. As the modified refractive index portion, a modified refractive index member whose refractive index differs from that of the plate member may be used instead of the air hole. The air hole is advantageous in that it can be easily manufactured, whereas the modified refractive index member is favorable in the case where the plate member may be deformed due to heat or other factors during the manufacturing process.

(2) Method for Manufacturing the Two-Dimensional Photonic Crystal Laser of the Present Embodiment A method for manufacturing the two-dimensional photonic crystal laser 10 is described using FIGS. 3 and 4. FIG. 3 is a vertical sectional view illustrating the manufacturing method according to the present embodiment, and FIG. 4 is a top view of various patterns drawn in a resist used in the manufacturing method of the present embodiment.

Initially, a first substrate 211 is prepared, on which a laminated body 20 is created by layering, in this order, the first etch-stop layer 221, second plate member 122A, second carrier-blocking layer 132, active layer 11, first carrier-blocking layer 131 and first plate member 121A (FIG. 3(a)). The laminated body 20 can be created by sequentially forming each layer by MO-CVD (metal organic chemical vapor deposition) or other methods. No air hole is bored in the first plate member 121A or the second plate member 122A at this stage.

Next, a first resist 231 is applied to the first plate member 121A, and a cross mark 251 is drawn at each of the four corners of the first resist 231 (FIG. 4(a)). Then, the laminated body 20 is etched through the cross marks 251 by an inductively coupled plasma (ICP) or the like to create positioning marks 26 penetrating through the laminated body 20 (FIG. 3(b)). After the first resist 231 is removed, a second resist 232 is freshly applied. With positioning marks 26, which are visible through the second resist 232, as the reference points, circular holes 271 are drawn at the positions corresponding to the air holes 121B (FIG. 4(b)). Through these circular holes 271, the first plate member 121A is etched by an ICP or the like to create air holes 121B in the first plate member 121A. Thus, the first photonic crystal layer 121 is completed (FIG. 3(c)). After that, the second resist 232 is removed.

Separately, the second etch-stop layer 222, first contact layer 151, first cladding layer 141 and first fusion layer 121C, which is made of the same material as that of the plate member 121A, are formed in this order on a second substrate 212, and then the first plate member 121A and the first fusion layer 121C are fused together (FIG. 3(d)). Then, the first substrate 211 is removed by abrading and wet-etching processes, and further, the first etch-stop layer 221 is removed with a different etching agent (FIG. 3(e)). Subsequently, a third resist 233 is applied to the surface of the second plate member 122A, which has been exposed as a result of removing the first substrate 211 and first etch-stop layer 221. With positioning marks 26, which are visible through the third resist 233, as the reference points, circular holes 272 are drawn at the positions corresponding to the air holes 122B (FIG. 4(c)) so that the positions of the columns of the air holes 121B in the x-axis direction (FIG. 2) coincide with those of the air holes 122B. Through these circular holes 272, the second plate member 122A is etched by an ICP or the like to create air holes 122B in the second plate member 122A. Thus, the second photonic crystal layer 122 is completed (FIG. 3(f)). After that, the third resist 233 is removed.

Separately, the second cladding layer 142 and the second fusion layer 122C, which is made of the same material as that of the second plate member 122A, are formed in this order on a third substrate 213 made of the same material as that of the second contact layer 152, and then the second plate member 122A and the second fusion layer 122C are fused together (FIG. 3(g)). Then, the second substrate 212 is removed by abrading and wet-etching processes, and further, the second etch-stop layer 222 is removed with a different etching agent. Subsequently, the third substrate 213 is mirror polished until its thickness is reduced to a predetermined thickness. The third substrate 213 with its thickness thus reduced becomes the second contact layer 152. Furthermore, a first electrode 161 is created on the surface of the first contact layer 151, and a second electrode 162 on the surface of the second contact layer 152. Thus, the two-dimensional photonic crystal laser 10 is completed (FIG. 3(h)).

(3) Operation of the Two-Dimensional Photonic Crystal Laser of the Present Embodiment In the two-dimensional photonic crystal laser of the present embodiment, when a voltage is applied between the first electrode 161 and the second electrode 162, electrons and positive holes are supplied into the active layer 11. These electrons and positive holes recombine together, emitting light with a predetermined wavelength range. This light is introduced into both the first photonic crystal layer 121 and the second photonic crystal layer 122. In these layers, light having a wave number $k_1$ corresponding to the period of the modified refractive index portions in the first photonic crystal layer 121 is amplified within the first photonic crystal layer 121, while another light having a wave number $k_2$, which corresponds to the period of the modified refractive index portions in the second photonic crystal layer 122 and differs from the wave number $k_1$, is amplified within the second photonic crystal layer 122. These light having the wave numbers $k_1$ and $k_2$ generate a spatial beat of light. As a result, a laser oscillation occurs at a non-$\Gamma$ point ($k_{//} \neq 0$) and oblique side beams are produced.

The process of generating oblique side beams is hereinafter described using a specific example. The following description deals with the case where $a_1 = a$ and $a_2 = 1.02a$ in the two-dimensional photonic crystal laser 10. In this case, since the period $a_1$ of the first photonic crystal layer 121 differs from the period $a_2$ of the second photonic crystal layer 122, a standing wave having a different wave number is formed in each of these two-dimensional photonic layers. These standing waves are superposed with each other, causing a spatial beat in the x-directional component $E_x$ of the electric field strength. FIG. 5 shows $E_x$ at a specific point in time, calculated by a finite difference time domain (FDTD) method. The calculated result demonstrates that $E_x$ has a spatial beat with a period $a_b \sim 51a$. The calculated period $a_b$ of the spatial beat satisfies the relationship expressed as $1/a_1 - 1/a_2 = 1/a_b$. Fourier transformation of the calculated value $E_x$ yields a spectrum of $k_x$, i.e. the x-component of the wave number. The result of the Fourier transformation of $E_x$ obtained in FIG. 5 is shown in FIG. 6. This figure shows the result only for positive values of $k_x$; a similar result will also be obtained for negative values of $k_x$. This graph shows a peak located at $k_x = \pm 0.0196 \times (2\pi/a)$ and a weaker peak located at $k_x = \pm 0.0392 \times (2\pi/a)$. In regard to the y-component $k_y$ of the wave number, the peak appears only when $k_y = 0$ since there is no difference in the y-directional period between the two-dimensional photonic crystal layers.

Letting $\theta$ denote the angle between a line perpendicular to the two-dimensional photonic crystal layer and the wave vector, $\theta$ and $k_x$ satisfy the following relationship (FIG. 7):

$$k_x = k \sin \theta = (a/\lambda) \sin \theta \quad (1).$$

In the present case, $\lambda = 980$ nm (the wavelength of light generated by the active layer 11 made of InGaAs), $a = 296$ nm (the period of a two-dimensional photonic crystal that can amplify light having the aforementioned wavelength $\lambda$ in the case where the plate member is made of GaAs), and $k_x$ is the wave number at which a peak is located in FIG. 6. Substituting these values into equation (1) shows that side beams are produced in the directions $\theta = 3.8°$ ($k_x = 0.0196 \times (2\pi/a)$) and $\theta = 7.6°$ ($k_x = 0.0392 \times (2\pi/a)$).

In FIG. 6, the peak corresponding to the main beam, i.e. a laser beam that is emitted in the direction perpendicular to the two-dimensional photonic crystal ($\theta = 0$, $k = 0$), is hardly recognizable. This is because FIG. 6 shows a spectrum at a specific point in time where the peak at $k_x = 0.0196 \times (2\pi/a)$ is maximized. However, a clear peak actually also appears at $k = 0$ at other points in time. FIG. 8 shows a temporal change of peak value calculated for a Fourier transform image of $E_x$ at $k_x = 0$, $0.0196 \times (2\pi/a)$ and $0.0392 \times (2\pi/a)$. The strength of actually emitted laser light corresponds to the magnitude of the time-averaged value of this calculated result. This result shows that the strongest laser beam is $k_x=0$, i.e. the main beam, and the second strongest laser beam is the side beam generated at $k_x=0.0196\times(2\pi/a)$.

FIG. 9 shows the spatial distribution of $E_x$ calculated for $a_1=a$ and $a_2=1.04a$ in the two-dimensional photonic crystal laser 10, and FIG. 10 shows a Fourier transform image of the spatial distribution of $E_x$. In this example, a peak is observed at $k_x=0.0392\times(2\pi/a)$. Accordingly, from equation (1) it can be demonstrated that a side beam is generated in the direction of $\theta=7.6°$.

(4) Experimental Example of the Two-Dimensional Photonic Crystal Laser 10

Two types of the two-dimensional photonic crystal laser 10 were manufactured with (a) $a_2=1.06a_1$ (0.305 μm) and (b) $a_2=1.08a_1$ (0.311 μm), where $a_1=0.288$ μm, and an experiment was conducted to take a photograph of the far-field pattern of the laser beams. The far-field patterns obtained in this experiment are shown in FIG. 11. Two oblique beams were observed in either of (a) and (b). An estimation of $2\theta$ from the distance between the two oblique beams resulted in $2\theta=9.5°$ for (a) and $2\theta=14.4°$ for (b). In addition, the spectrums of the laser lights thereby obtained are shown in FIG. 12. In either of (a) $a_2=1.06a_1$ and (b) $a_2=1.08a_1$, the resultant laser light was a single-wavelength light with the central wavelength at (a) 973.5 nm or (b) 973.8 nm.

(5) Example of Embodiments Other than the Two-Dimensional Photonic Crystal Laser 10

The configuration of the two-dimensional photonic crystal laser according to the present invention is not limited to the previously described embodiment (i.e. the two-dimensional photonic crystal laser 10). For example, the two-dimensional photonic crystal layer 122 having a rectangular lattice may be replaced by a two-dimensional photonic crystal layer having a square lattice with a period $a_2$. This configuration provides a two-dimensional photonic crystal laser in which a spatial beat is generated in both the x and y directions so that a side beam inclined in the x-direction and a side beam inclined in the y-direction are emitted. It is also possible to set the x-directional period at $a_2$ and y-directional period at $a_3(\neq a_1, a_2)$ to obtain a two-dimensional photonic crystal laser that emits a side beam inclined in the x-direction and a side beam inclined in the y-direction by an angle different from that of the side beam in the x-direction. It is also possible to provide both the first and second photonic crystal layers on the upper (or lower) side of the active layer.

(6) Application Example of the Two-Dimensional Photonic Crystal Laser According to the Present Invention As an application example of the two-dimensional photonic crystal laser according to the present invention, an optical disk recording/reproducing device 30 is described using FIGS. 13 and 14. FIG. 13(*a*) is a schematic configuration diagram of the optical disk recording/reproducing device 30 using a two-dimensional photonic crystal laser 31 according to the present invention. FIG. 13(*b*) is a schematic configuration diagram of a conventional optical disk recording/reproducing device 30P. This conventional optical disk recording/reproducing device 30P is the one disclosed in Patent Document 2 and Non-Patent Document 2.

The optical disk recording/reproducing device 30 includes a two-dimensional photonic crystal laser 31 according to the present invention, which emits a main beam 360 with a first side beam 361 and second side beam 362 that are symmetrical with respect to the axis of the main beam 360. For example, the two-dimensional photonic crystal laser 10 in the previous embodiment can be used as the two-dimensional photonic crystal laser 31. The optical disk recording/reproducing device 30 also includes an optical system 33, which consists of a lens and other components for delivering the main beam 360, first side beam 361 and second side beam 362 from the two-dimensional photonic crystal laser 31 onto an optical disk 39, and a detector 34 for detecting a laser light reflected by the optical disk 39. The optical system 33 includes a track follow-up mirror 331 that can be moved for adjusting the spot position of the laser beam focused on the optical disk 39.

An operation of this optical disk recording/reproducing device 30 is described. The description mainly focuses on the operation for making the main beam 360 follow up the track of the optical disk. The main beam 360, first side beam 361 and second side beam 362, all being emitted from the two-dimensional photonic crystal laser 31, are focused onto the record surface of the optical disk 39 by the optical system 33, then reflected by the record surface, and ultimately detected by the detector 34. Since the shape of the information track 37 on the record surface is bilaterally symmetrical, the strengths of the first and second side beams 361 and 362 thereby detected will be equal to each other when the main beam 360 is correctly focused on the center of the information track 37 (FIG. 14(*a*)) or different from each other when the main beam 360 is displaced from the center (FIG. 14(*b*)). When a displacement is detected, it is possible to correct the focusing position of the main beam 360 by moving the track follow-up mirror 331 so that the detected strengths of the first and second side beams 361 and 362 will be equal to each other.

On the other hand, the conventional optical disk recording/reproducing device 30P includes a laser 32A emitting only a single beam, and a diffraction grating 32B for diffracting the single beam into three beams. The other components are identical to those of the previously described optical disk recording/reproducing device 30. Thus, the optical disk recording/reproducing device 30 in the present embodiment, which does not require the diffraction grating, is more suited for the miniaturization and cost reduction of the device.

(7) First Embodiment of the Emitting Direction Variable Photonic Crystal Laser According to the Present Invention An emitting direction variable photonic crystal laser 40 as the first embodiment is described using FIGS. 15 and 16. FIG. 15 is a vertical sectional view of the emitting direction variable photonic crystal laser 40. This emitting direction variable photonic crystal laser 40 includes an active layer 11, first carrier-blocking layer 131, second carrier-blocking layer 132, first cladding layer 141, second cladding layer 142, first contact layer 151 and second contact layer 152. These layers are identical to those of the previous two-dimensional photonic crystal laser 10. Furthermore, the present laser has a first photonic crystal layer 421 on one side (upper side) of the active layer 11, with the first carrier-blocking layer 131 in between, and a second photonic crystal layer 422 on the other side (lower side) of the active layer 11, with the second carrier-blocking layer 132 in between. The first photonic crystal layer 421 is structurally identical to that of the previous two-dimensional photonic crystal 10, whereas, as will be described later, the second photonic crystal layer 422 is structurally different from the second photonic crystal layer 122 in the previous two-dimensional photonic crystal 10.

The second photonic crystal layer 422 has a first modified period area 4221, second modified period area 4222, third modified period area 4223, and so on in a plate member 422A. In each modified period area, air holes (modified refractive index portions) 422B are arranged with a period that differs from those of the other modified period areas. In the present embodiment, the air holes 422B have a circular horizontal shape and are arranged in a rectangular lattice pattern in the plate member 422A, as shown by the top view in FIG. 16(a). The period of the rectangular lattice in one direction (y-axis direction) is $a_1$, which equals that of the first photonic crystal layer 421, whereas the period in the perpendicular direction (x-axis direction) is $a_{21}$ in the first modified period area 4221, $a_{22}$ in the second modified period area 4222, $a_{23}$ in the third modified period area 4223, and so on.

A first upper electrode 4611, second upper electrode 4612, third upper electrode 4612, and so on are provided on the upper surface of the first contact layer 151 and directly above the first modified period area 4221, second modified period area 4222, third modified period area 4223, and so on. One lower electrode 462 is provided on the lower surface of the second contact layer 152.

An operation of the emitting direction variable photonic crystal laser 40 in the first embodiment is now described. Firstly, a voltage is applied between one of the upper electrodes (the first upper electrode 4611, second upper electrode 4612, third upper electrode 4613, and so on) and the lower electrode 462. The following explanation assumes that the voltage is initially applied between the first upper electrode 4611 and the lower electrode 462. Due to this voltage application, electrons and positive holes are supplied into the portion of the active layer 11 located directly below the first upper electrode 4611, and an emission of light with a predetermined wavelength range occurs within that portion. This light is introduced into the first photonic crystal layer 421 and also the first modified period area 4221 of the second photonic crystal layer 422 located directly below the first upper electrode 4611. Then, light having a wave number $k_1$ corresponding to the period $a_1$ is amplified within the first photonic crystal layer 421, and simultaneously another light having a wave number $k_{21}(\neq k_1)$ corresponding to the x-directional period $a_{21}$ is also amplified in the x-direction within the first modified period area 4221. As a result, a spatial beat of light is generated, and side beams each being inclined in the x-direction by an angle corresponding to the difference in the wave number are emitted, as in the case of the two-dimensional photonic crystal laser 10.

Secondly, the upper electrode to which the voltage is applied is switched from the first upper electrode 4611 to another upper electrode (which is the second upper electrode 4612 in the present case). Then, as in the case of the first upper electrode 4611, light having a wave number $k_{22}(\neq k_1, k_{21})$ corresponding to the x-directional period $a_{22}(\neq a_{21})$ is amplified in the x-direction within the second modified period area 4222 located directly below the second upper electrode 4612. Since the light thus amplified has a wave number that differs from that of the light generated in the case where the first upper electrode 4611 was used, the inclination angle of the resultant side beams in the x-direction will be different from the angle observed in the case where the first upper electrode 4611 was used. Applying the voltage between the lower electrode 462 and the third upper electrode 4613 or any other electrode will similarly produce side beams each being inclined in the x-direction by an angle that corresponds to the period of the modified period area located directly below the newly selected upper electrode and therefore differs from the angle observed in the case where any other upper electrode was used.

Other examples of the configuration of the second photonic crystal layer 422 are shown by the plan views in FIGS. 16(b) to 16(d). In case (b), all the modified period areas have the period $a_1$ in the x-direction, which equals the period of the first photonic crystal layer 421, whereas the period in the y-direction varies from one modified period area to another, such as $a_{21}$, $a_{22}$, $a_{23}$ and so on. In this case, when the upper electrode to which the voltage is applied is switched, side beams that are inclined in the y-direction by an angle corresponding to the period of the modified period area located directly below the newly selected upper electrode are produced. In case (c), the period in the x-direction equals the period in the y-direction in every modified period area (i.e. the square lattice), and this period varies from one modified period area to another. In this case, when the upper electrode to which the voltage is applied is switched, side beams are produced in both the x and y directions, each side beam being inclined in the x or y direction by an angle corresponding to the period of the modified period area located directly below the newly selected upper electrode. In case (d), the air holes having a circular horizontal shape in case (a) have been changed to air holes having an equilaterally triangular horizontal shape. This change in the shape of the air holes does not affect the emitting direction of the side beams.

In the previous examples, only the upper electrodes were separately provided for each modified period area. However, it is possible to separately provide only the lower electrodes for each modified period area, or both the upper and lower electrodes for each modified period area.

(8) Second Embodiment of the Emitting Direction Variable Photonic Crystal Laser According to the Present Invention An emitting direction variable photonic crystal laser 50 as the second embodiment is described using FIGS. 17 to 20. FIG. 17 is a vertical sectional view of the emitting direction variable photonic crystal laser 50. This emitting direction variable photonic crystal laser 50 is structurally identical to the emitting direction variable photonic crystal laser 40 of the first embodiment except that it includes a second photonic crystal layer 522 and upper electrodes (which will be described later) in place of the photonic crystal layer 422 and upper electrodes used in the emitting direction variable photonic crystal laser 40.

As shown by the top view in FIG. 18, the second photonic crystal layer 522 comprises a plate member 522A in which circular air holes 522B are arranged in an orthogonal lattice pattern. The arrangement period of the air holes 522B in the y-direction is $a_1$, which equals that of the air holes in the first photonic crystal layer 421, whereas their arrangement period in the x-direction continuously changes; the distances $a_{21}$, $a_{22}$, $a_{23}$ . . . between the neighboring air holes in the x-direction gradually increase in the positive direction ($a_{21} < a_{22} < a_{23} < \ldots$). For example, if the distance between the neighboring air holes is increased in steps of 0.1% in the positive direction, the distance values at two points intervened by 100 air holes will have a 10% difference.

The upper electrode 561 is divided into a large number of electrodes (the first upper electrode 5611, second upper electrode 5612 and so on) arrayed in the x-direction on the first contact layer 151 (FIG. 17).

An operation of the emitting direction variable photonic crystal laser 50 is described using FIG. 19. Firstly, a voltage is applied between two or more neighboring upper electrodes 561 and the lower electrode 462. For example, suppose that the voltage is applied between three electrodes (the first upper electrode 5611, second upper electrode 5612 and third upper electrode 5613) and the lower electrode 462 (FIG. 19(*a*)). Due to this voltage application, electrons and positive holes are supplied into the portion directly below the first, second and third upper electrodes 5611 to 5613 (this portion is called the first current supply area 571), and an emission of light with a predetermined wavelength range occurs within that portion. This light is introduced into the first photonic crystal layer 421 and also the portion of the second photonic crystal layer 522 located directly below the first, second and third upper electrodes 5611 to 5613 (this portion is called the first light-amplifying area 581). Then, light having a wave number $k_1$ corresponding to the period $a_1$ is amplified within the first photonic crystal layer 421, and simultaneously light having a wave number corresponding to the average period in the first light-amplifying area 581 is also amplified within the second photonic crystal layer 522. Due to a difference in the period in the x-direction, the wave number of the light amplified within the second photonic crystal layer 522 in the x-direction differs from the wave number $k_1$ in the first photonic crystal layer 421. As a result, a spatial beat of light is generated, and side beams each being inclined in the x-direction by an angle corresponding to the difference in the wave number are produced.

Secondly, the upper electrodes being used for applying the voltage are changed to the second upper electrode 5612, third upper electrode 5613 and fourth upper electrode 5614 (FIG. 19(*b*)). As a result, the current supply area and light-amplifying area are shifted in the x-direction (the second current supply area 572 and second light-amplifying area 582). The average period of the second photonic crystal layer 522 in the second light-amplifying area 582 differs from the period in the first light-amplifying area 581. Therefore, the shift of the light-amplifying area changes the wave number of the light amplified within the second photonic crystal layer 522 and further the inclination angle of the side beam, which depends on the wave number. It is possible to continuously change the inclination angle of the side beam in a similar manner by changing the upper electrodes being used for the voltage application so as to sequentially shift the light-amplifying area.

FIG. 20 shows another example of the second photonic crystal layer 522 (the second photonic crystal layer 522X) in the emitting direction variable photonic crystal laser 50 of the second embodiment. The second photonic crystal layer 522X is designed so that the distance of the neighboring air holes gradually increases in the positive direction of the y-direction ($a_{21} < a_{22} < a_{23} < \ldots$) as well as in the positive direction of the x-direction ($a_2 < a_{22} < a_{23} < \ldots$). As a result, oblique side beams are generated in each of the x and y directions. In the case of using this second photonic crystal layer 522X, it is necessary to use an upper electrode that is divided in both x and y directions. In addition, the shape of the air holes, which was circular in the second photonic crystal layer 522 or 522X, may be an equilateral triangle or any other shape.

As described thus far, the emitting direction variable photonic crystal laser according to the present invention emits multiple laser beams. If only a portion 491 of these multiple beams needs to be used, the other beams 493 can be blocked with a blocking member 492 (FIG. 21). For example, if an angular range from $\theta_a$ to $\theta_b$ is to be scanned with a single side beam (the first side beam 491) as shown in FIG. 21, the objective can be achieved by orienting the emitting direction variable photonic crystal laser 49 so that the perpendicular 493 to the photonic crystal layer is inclined from the center of the scan range by $(\theta_a + \theta_b)/2$ and setting a blocking plate 492 in the direction in which unnecessary beams are emitted.

(9) Example of a Photonic Crystal Laser Using a Photonic Crystal Comprising a Plate Member in Which Rods Are Arranged in One Direction FIG. 22 is a vertical sectional view of a photonic crystal laser 60 using a photonic crystal comprising a plate member in which rods are arrayed in one direction. FIG. 23 is a cross sectional view of the first photonic crystal layer 621 and second photonic crystal layer 622 in the photonic crystal laser 60. The first photonic crystal layer 621 comprises a first plate member 621A in which a large number of rod-shaped air holes 621B extending in the x-direction are periodically arranged along the y-direction. On the other hand, the second photonic crystal layer 622 comprises a second plate member 622A in which a large number of rod-shaped air holes 622B extending in the y-direction are periodically arranged along the x-direction. Furthermore, a defect 622C is created in the rods of the second plate member 622A by omitting one rod corresponding to one period. The other configurations are identical to those of the previously described photonic crystal laser 10.

The photonic crystal laser 60 in the present embodiment is identical to the photonic crystal lasers in the other embodiments in that an injection of an electric current from the first electrode 161 and second electrode 162 into the active layer 11 generates light and this light is introduced into the first photonic crystal layer 621 and second photonic crystal layer 622. The light introduced into the first photonic crystal layer 621 forms a y-directional standing wave due to the periodicity of the rod-shaped air holes 621B in the y-direction. By contrast, the light introduced into the second photonic crystal layer 622 form a standing wave not only in the x-direction, in which the rod-shaped air holes 622B has a periodicity, but also in the y-direction due to the presence of the defect 622C of the rods. As a result, a beat is generated from the y-directional standing wave within the first photonic crystal layer 621 and the y-directional component of the standing wave within the second photonic crystal layer 622, so that a main beam and two side beams that are inclined in the y-direction with respect to the main beam are produced.

The photonic crystal comprising a plate member in which rods are arrayed in one direction can also be used in the emitting direction variable photonic crystal laser. For example, as show in FIG. 24, it is possible to use a first photonic crystal layer 721 in which rod-shaped air holes 721B extending in the x-direction are arranged at equal intervals $a_1$ along the y-direction, with a defect 721C of the rods, and a second photonic crystal layer 722 in which rod-shaped air holes 722B extending in the y-direction are arranged along the x-direction with their intervals gradually increasing in the positive direction ($a_{21} < a_{22} < a_{23} < \ldots$). Use of these layers enables the emitting direction of the side beams to be controlled as in case of the emitting direction variable photonic crystal laser in the second embodiment.

Figure 1:
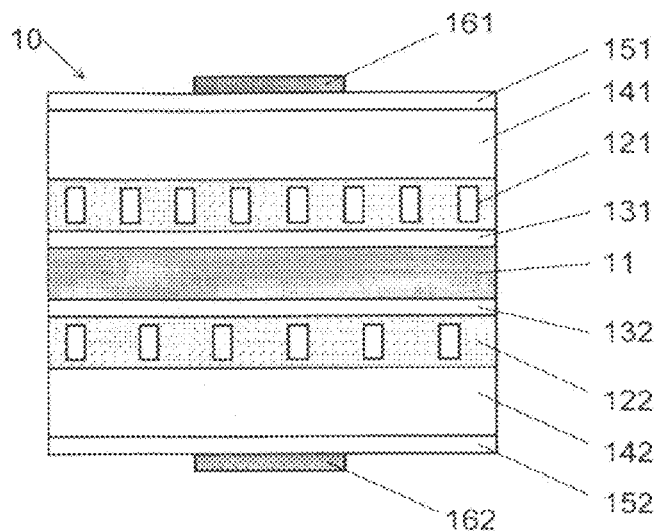
FIG. 1 is a vertical sectional view of a two-dimensional photonic crystal laser 10 according to one embodiment of the present invention.
Figure 2:
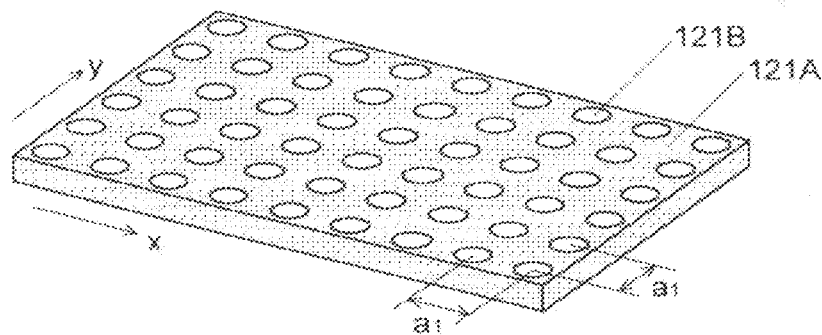
FIGS. 2(*a*) and 2(*b*) are perspective views of a first photonic crystal layer 121 and second photonic crystal layer 122 in the two-dimensional photonic crystal laser 10.
Figure 2:
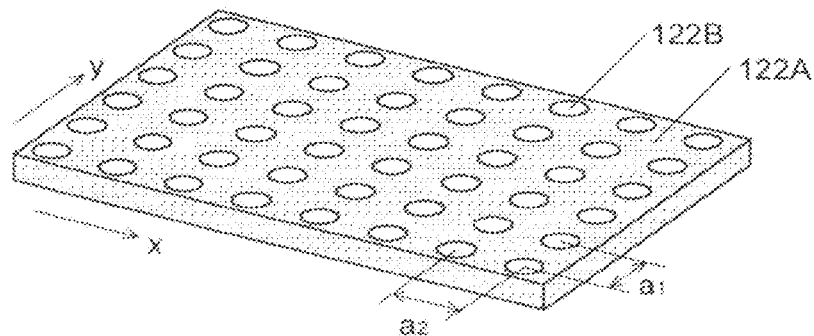
Figure 3:
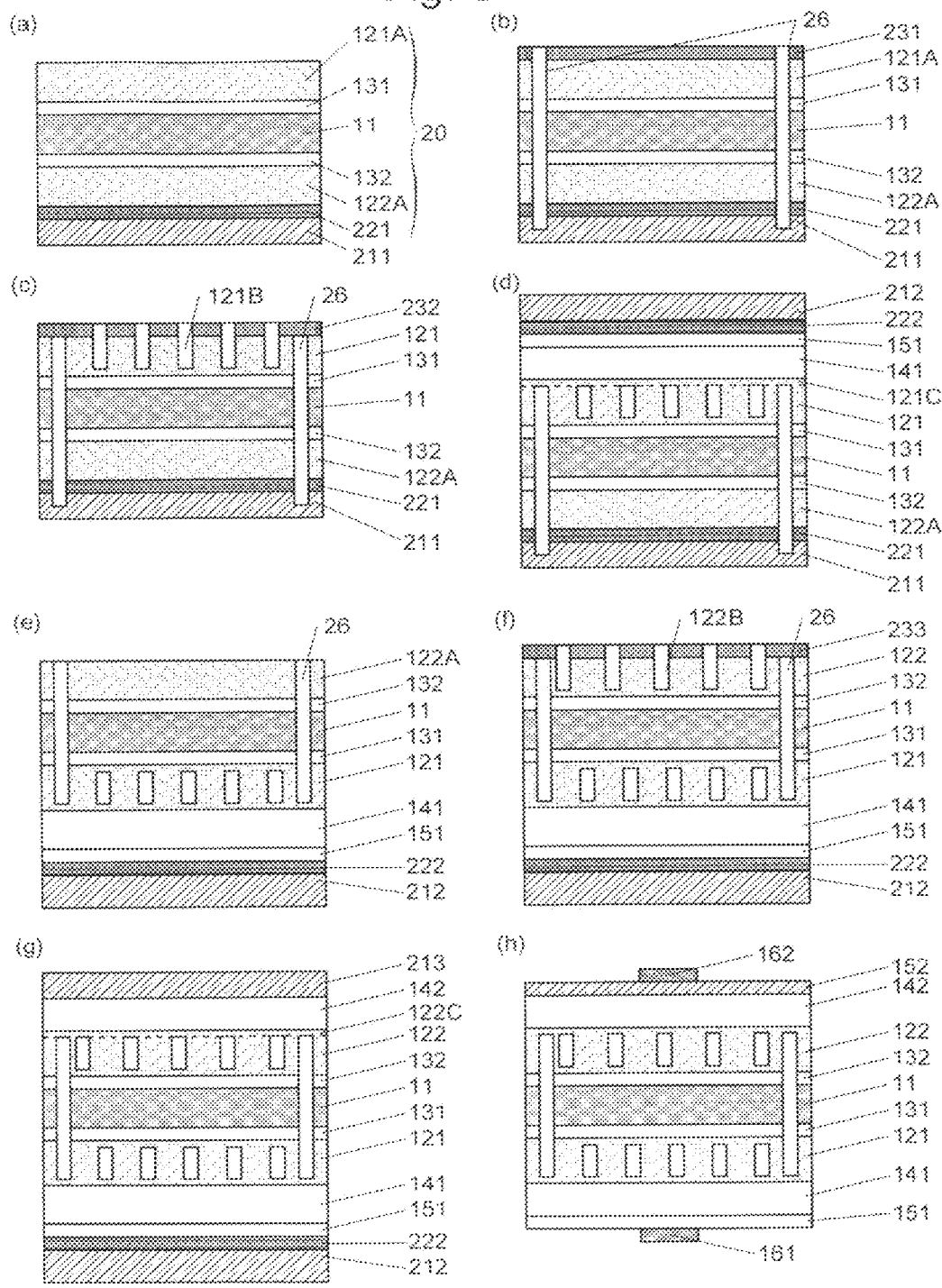
FIG. 3 is a vertical sectional view illustrating a method of manufacturing the two-dimensional photonic crystal laser 10.
Figure 4:
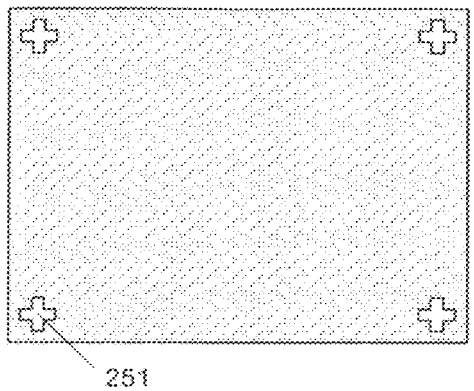
FIG. 4 is a top view of various patterns each drawn in a resist used in the manufacturing method of the present embodiment.
Figure 4:
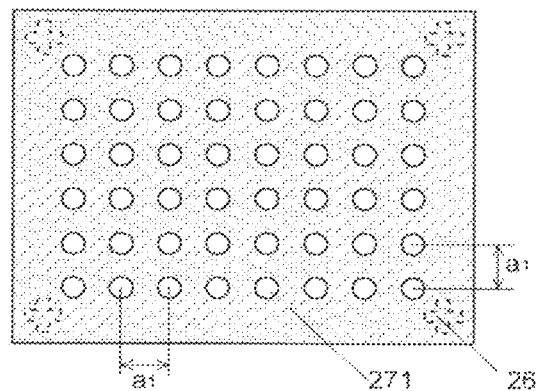
Figure 4:
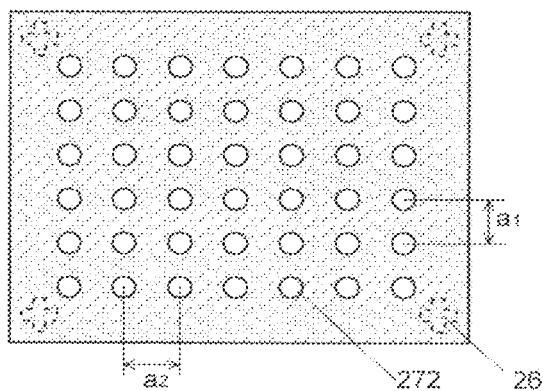
Figure 5:
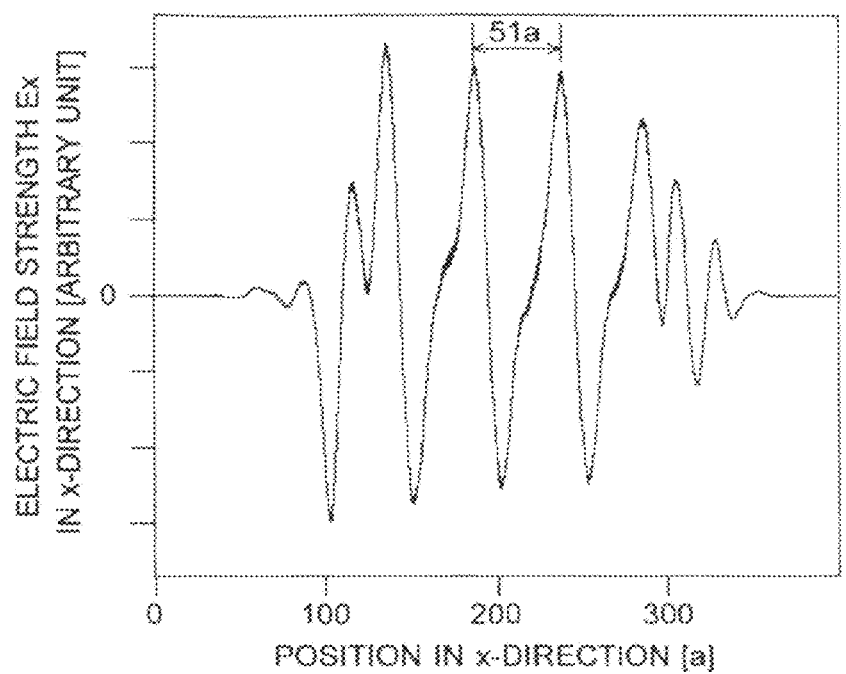
FIG. 5 is a graph showing the result of a calculation of the x-directional component $E_x$ of an electric field strength in the case of $a_1=a$ and $a_2=1.02a$.
Figure 6:
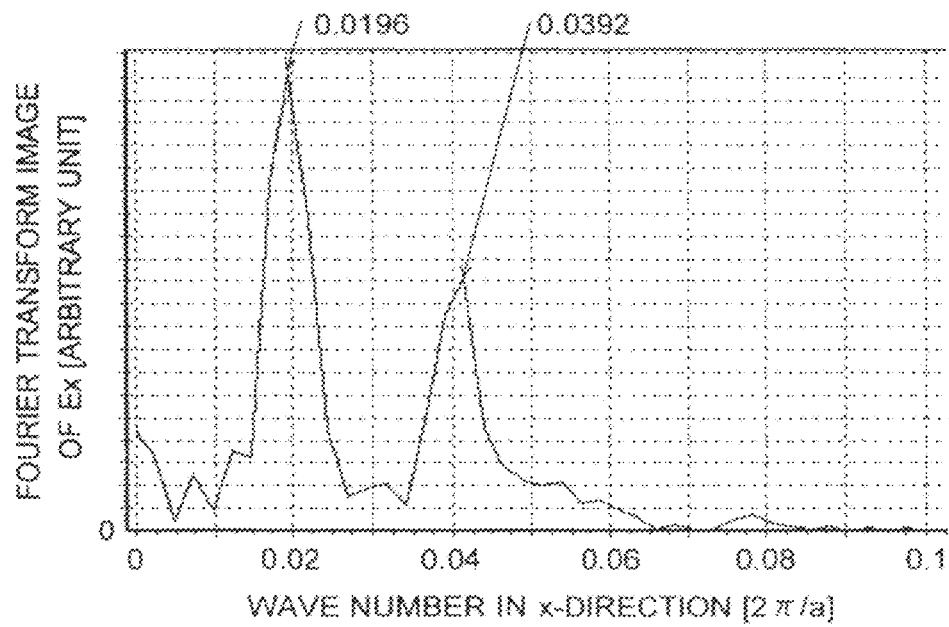
FIG. 6 is a graph showing the result of a calculation of a Fourier transformation image of $E_x$ in the case of $a_1=a$ and $a_2=1.02a$.
Figure 7:
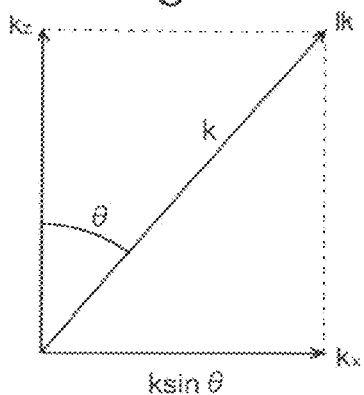
FIG. 7 is a diagram showing the relationship between an emission angle θ and the x-directional component $k_x$ of a wave number.
Figure 8:
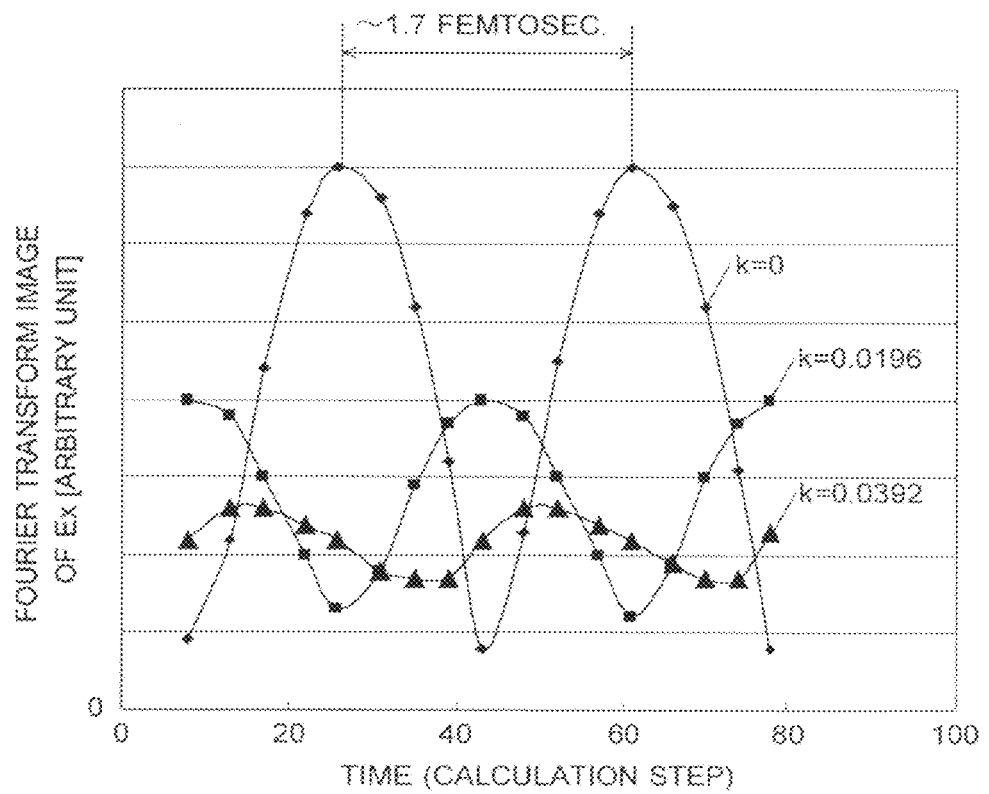
FIG. 8 is a graph showing a temporal change of each peak value calculated in the case of a Fourier transform image of $E_x$ in the case of $a_1=a$ and $a_2=1.02a$.
Figure 9:
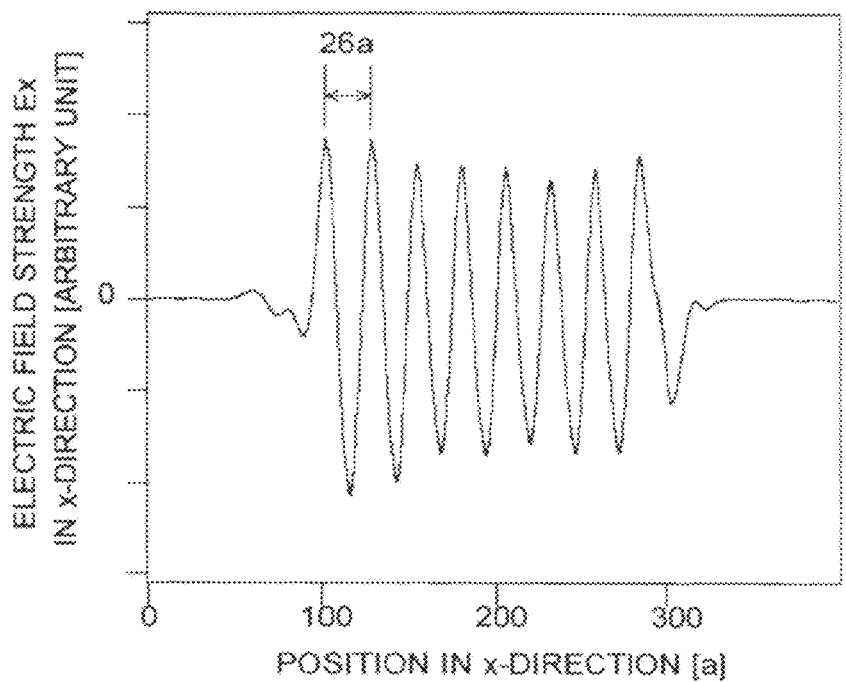
FIG. 9 is a graph showing the spatial distribution of $E_x$ calculated in the case of $a_1=a$ and $a_2=1.04a$.
Figure 10:
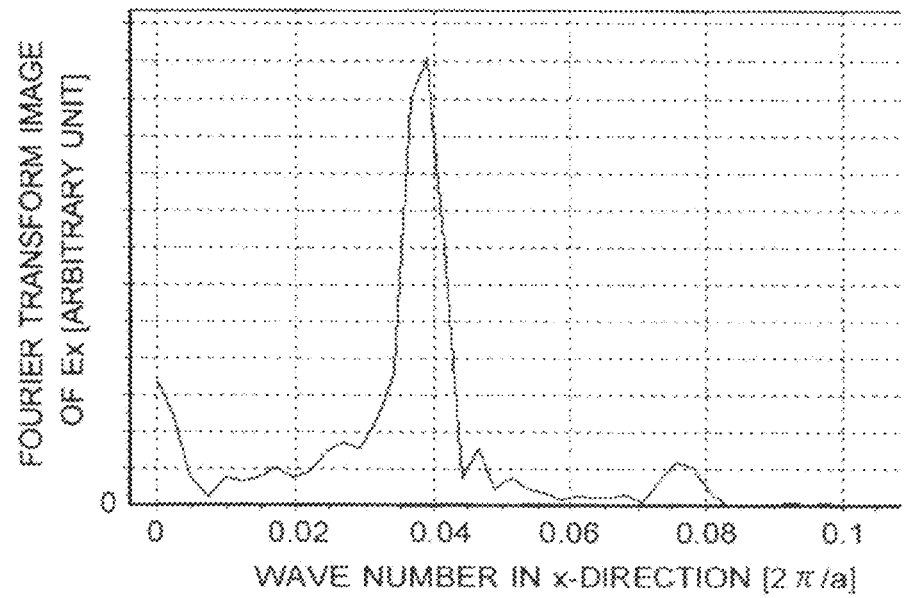
FIG. 10 is a graph showing a Fourier transform image of the spatial distribution of $E_x$ calculated in the case of $a_1=a$ and $a_2=1.04a$.
Figure 11:
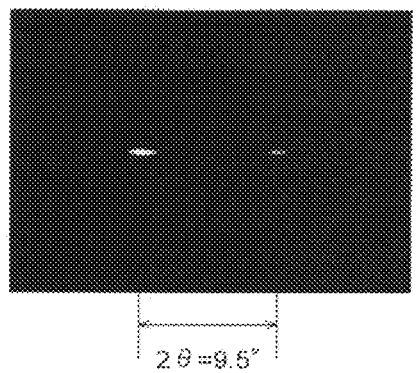
FIGS. 11(a) and 11(b) are photographs of side beams obtained in an experiment for the two-dimensional photonic crystal laser 10 with $a_1=a$ and $a_2=1.06a$ and $1.08a$.
Figure 11:
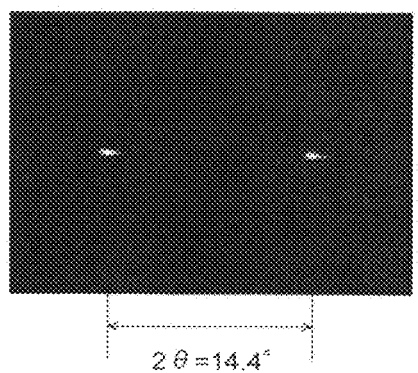
Figure 12:
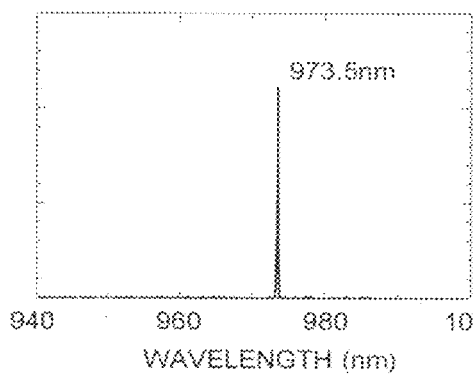
FIGS. 12(a) and 12(b) are spectrums of side beams obtained in an experiment for the two-dimensional photonic crystal laser 10 with $a_1=a$ and $a_2=1.06a$ and $1.08a$.
Figure 12:
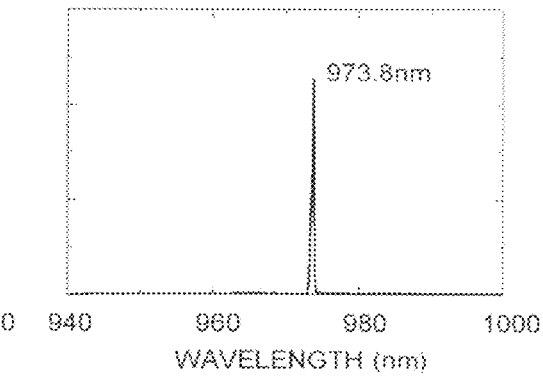
Figure 13:
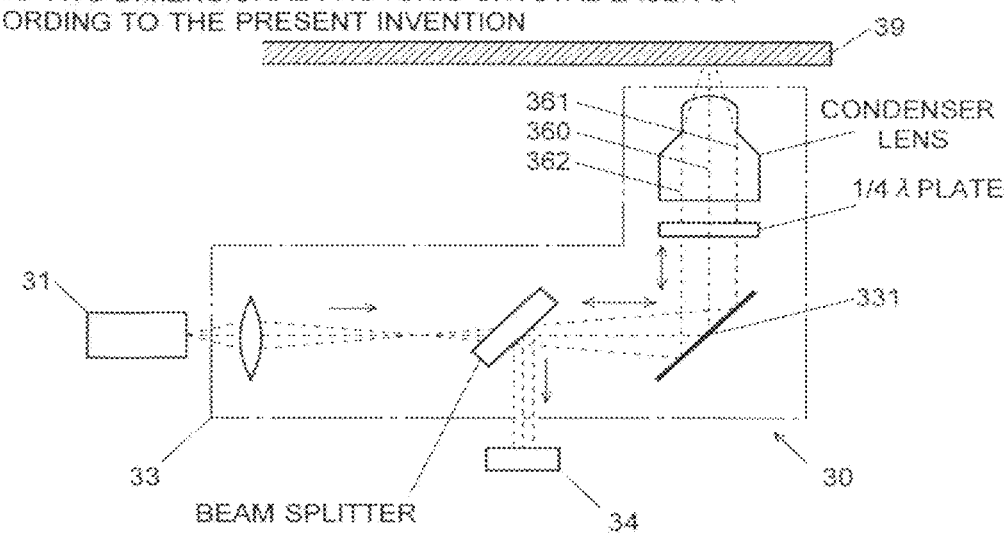
FIG. 13(a) is a schematic configuration diagram of an example of the optical disk recording/reproducing device using a two-dimensional photonic crystal laser according to the present invention.
FIG. 13(b) is a schematic configuration diagram of an example of conventional optical disk recording/reproducing devices.
Figure 13:
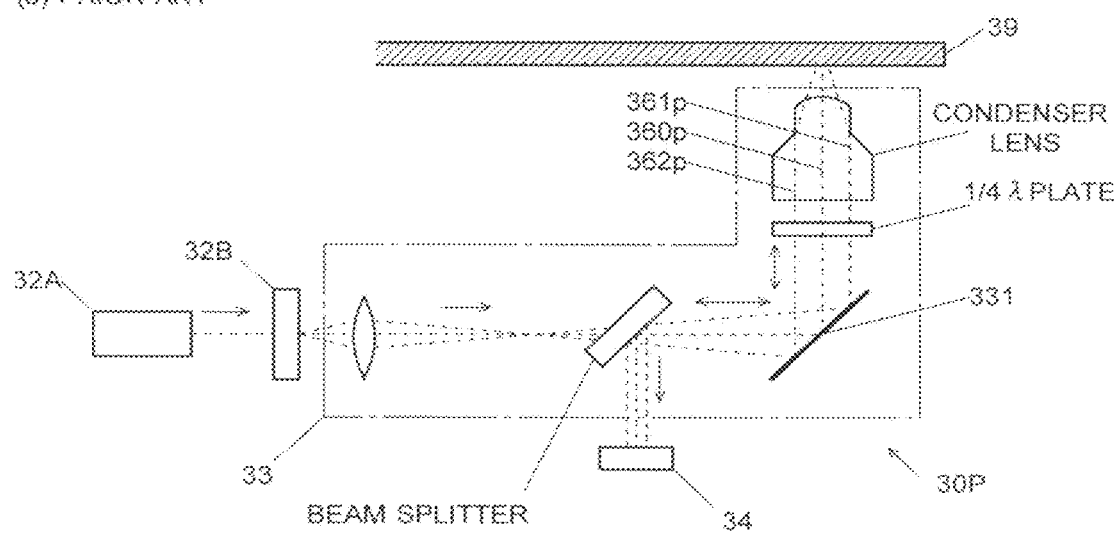
Figure 14:
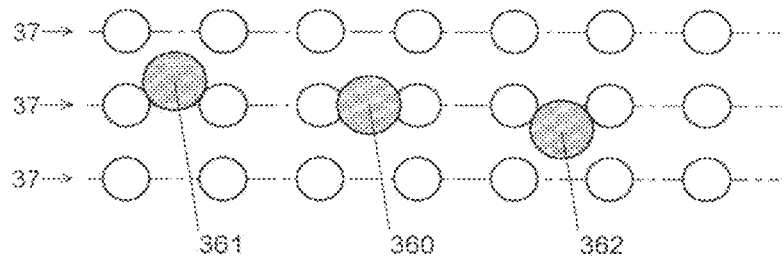
FIG. 14 is a schematic diagram for explaining an operation of an optical disk recording/reproducing device.
Figure 14:
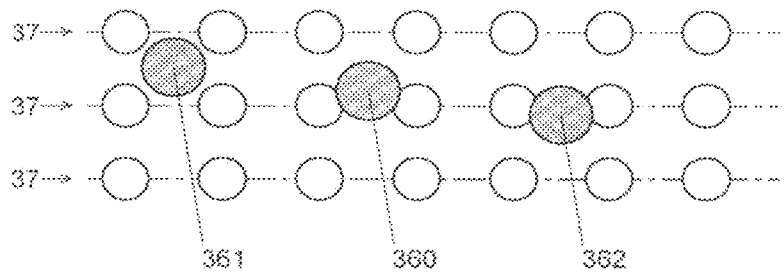
Figure 15:
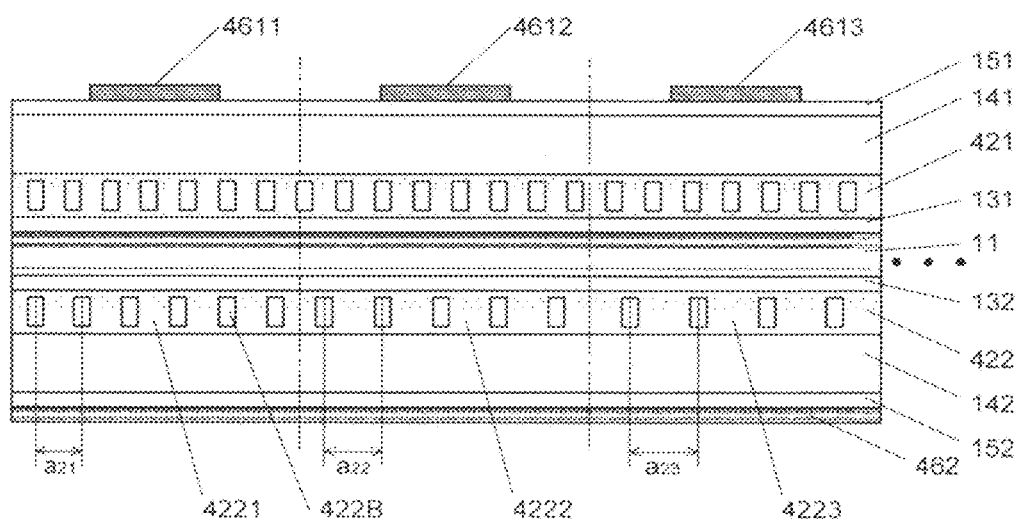
FIG. 15 is a vertical sectional view of the emitting direction variable photonic crystal laser 40 as a first embodiment.
Figure 16:
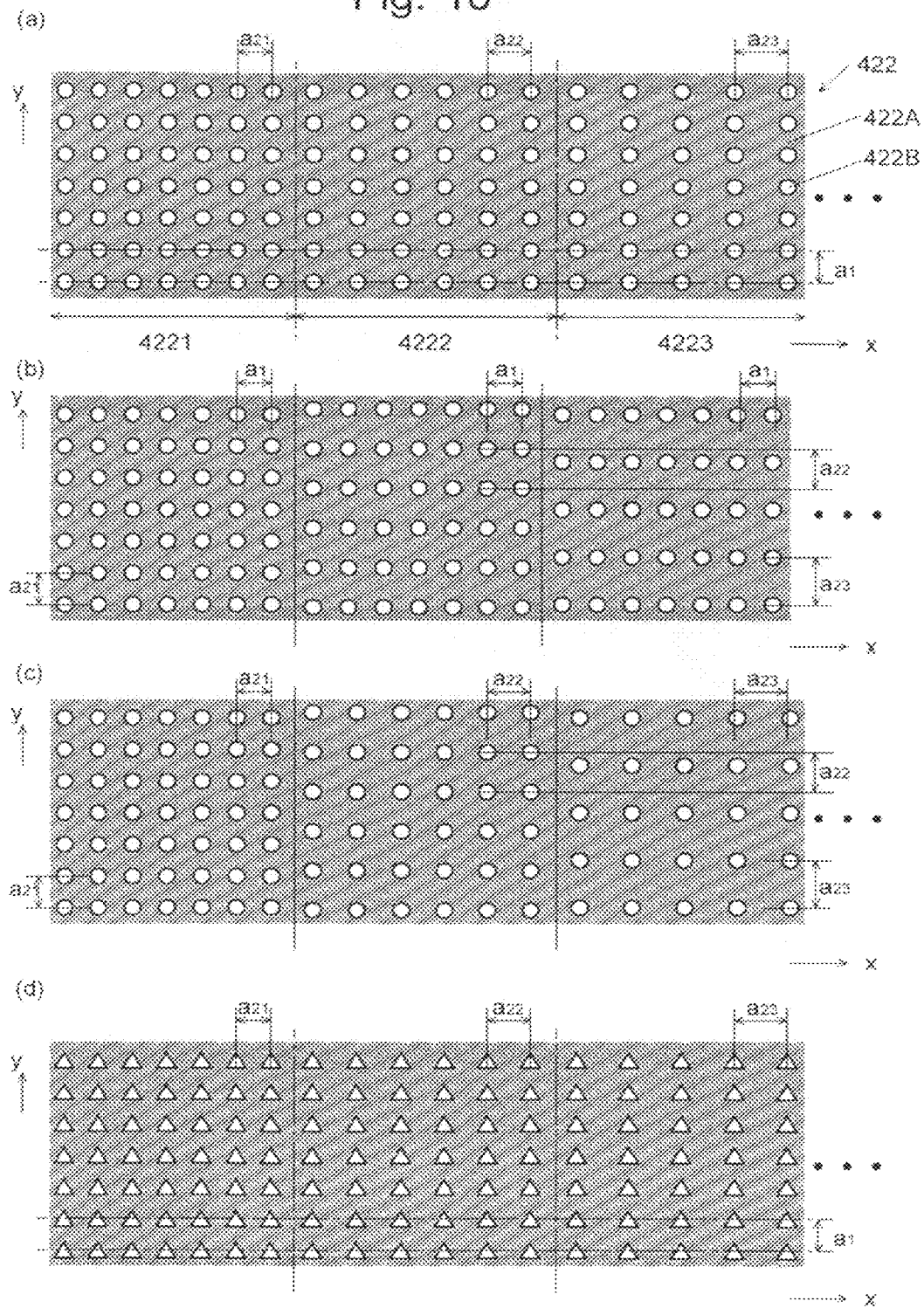
FIG. 16 is a plan view of the second photonic crystal layer 422 in the emitting direction variable photonic crystal laser 40.
Figure 17:
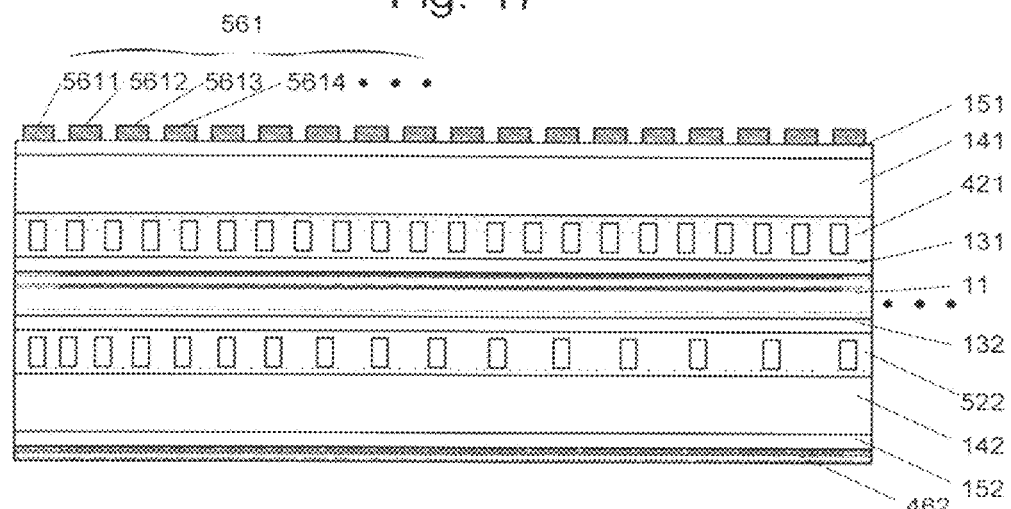
FIG. 17 is a vertical sectional view of the emitting direction variable photonic crystal laser 50 as a second embodiment.
Figure 18:
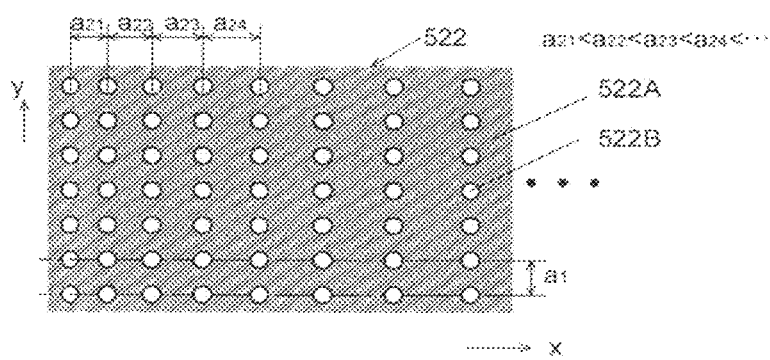
FIG. 18 a plan view of the second photonic crystal layer 522 in the emitting direction variable photonic crystal laser 50.
Figure 19:
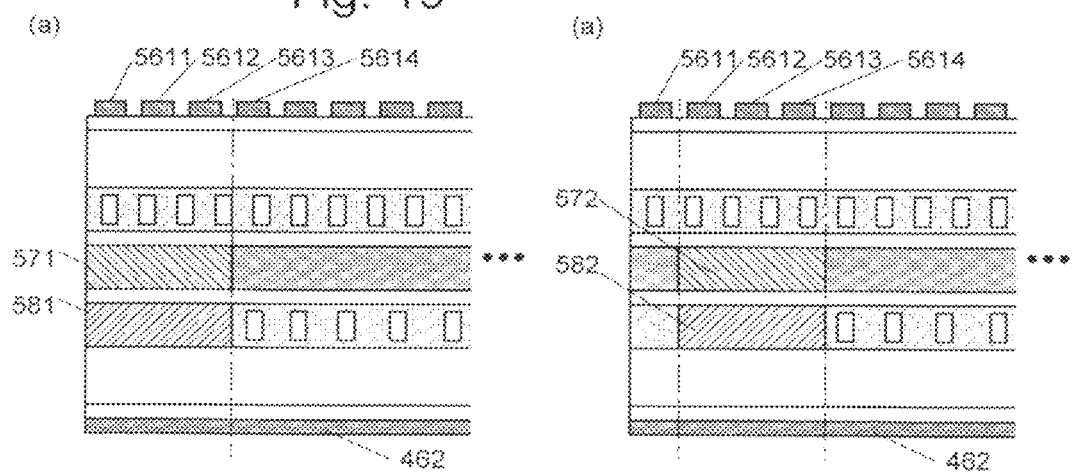
FIG. 19 is a vertical sectional view for explaining an operation of the emitting direction variable photonic crystal laser 50.
Figure 20:
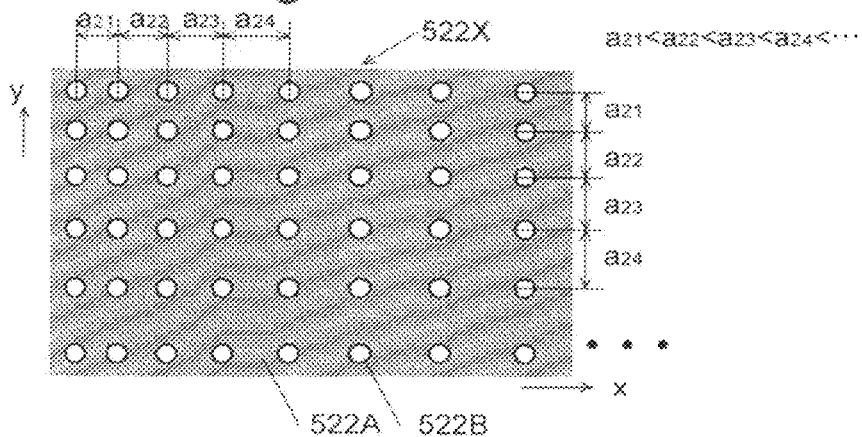
FIG. 20 is a plan view showing another example of the second photonic crystal layer 522.
Figure 21:
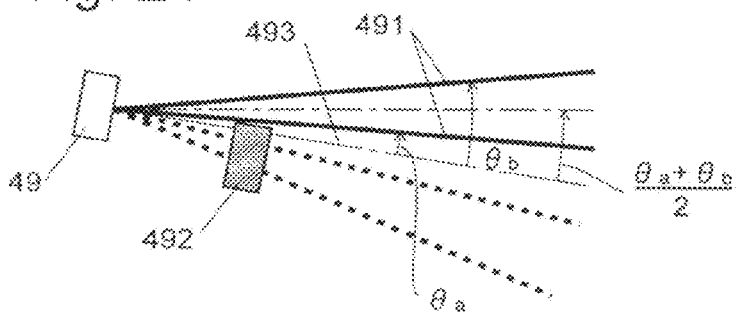
FIG. 21 is a schematic diagram showing an example of a method for blocking a portion of the laser beams.
Figure 22:
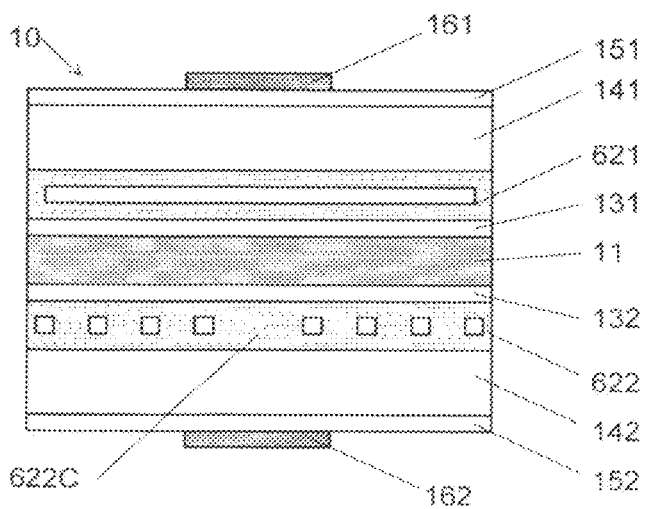
FIG. 22 is a vertical sectional view of a photonic crystal laser 60 using a photonic crystal comprising a plate member in which rods are arrayed in one direction.
Figure 23:
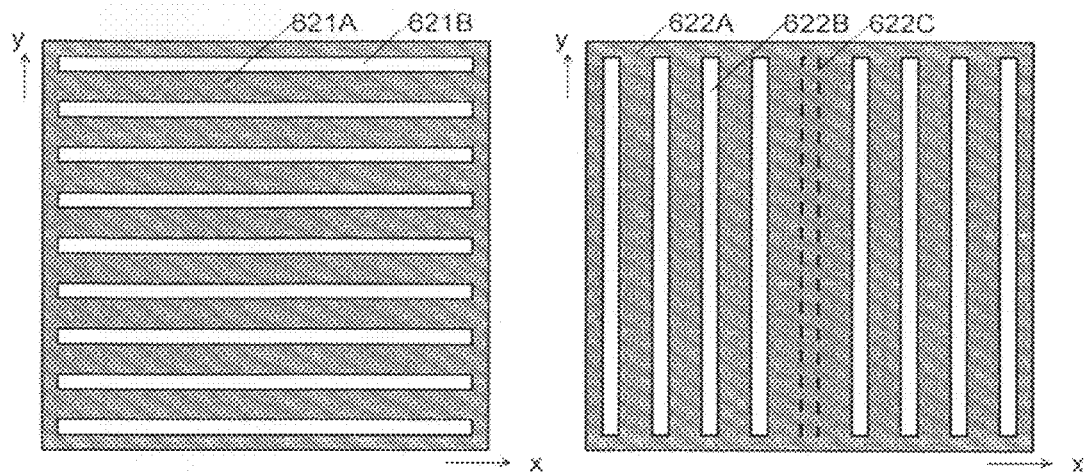
FIG. 23 a cross sectional view of the photonic crystal layers in the photonic crystal laser 60.
Figure 24:
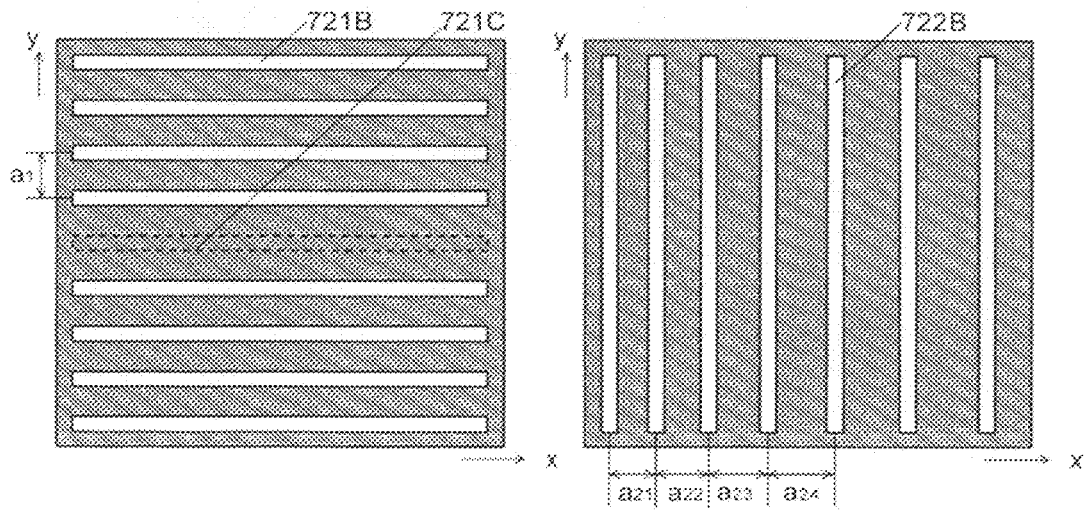
FIG. 24 is a cross sectional view showing an example of photonic crystals for use in a emitting direction variable photonic crystal laser, each photonic crystal comprising a plate member in which rods are arranged in one direction.

EXPLANATION OF NUMERALS 10, 31, 60 . . . Photonic Crystal Laser
11 . . . Active Layer
121, 421, 521, 621, 721 . . . First Photonic Crystal Layer
121A . . . First Plate Member
121B . . . First Air Hole
121C . . . First Fusion Layer
122, 422, 522, 522X, 622, 722 . . . Second Photonic Crystal Layer
122A . . . Second Plate Member
122B . . . Second Air Hole
122C . . . Second Fusion Layer
131 . . . First Carrier-Blocking Layer
132 . . . Second Carrier-Blocking Layer
141 . . . First Cladding Layer
142 . . . Second Cladding Layer
151 . . . First Contact Layer
152 . . . Second Contact Layer
161 . . . First Electrode
162 . . . Second Electrode
20 . . . Laminated Body
211 . . . First Substrate
212 . . . Second Substrate
213 . . . Third Substrate
221 . . . First Etch-Stop Layer
222 . . . Second Etch-Stop Layer
231 . . . First Resist
232 . . . Second Resist
233 . . . Third Resist
251 . . . Cross Mark
26 . . . Positioning Mark
271, 272 . . . Circular Hole
30 . . . Optical Disk Recording/Reproducing Device
30P . . . Conventional Optical Disk Recording/Reproducing Device
32A . . . Laser
32B . . . Diffraction Grating
33 . . . Optical System
331 . . . Track Follow-Up Mirror
34 . . . Detector
360 . . . Main Beam
361 . . . First Side Beam
362 . . . Second Side Beam
37 . . . Information Track
39 . . . Optical Disk
40, 50 . . . Emitting Direction Variable Photonic Crystal Laser
422A, 522A . . . Plate Member
422B, 522B . . . Air Hole
4221 . . . First Modified Period Area
4222 . . . Second Modified Period Area
4223 . . . Third Modified Period Area
4611 . . . First Upper Electrode
4612 . . . Second Upper Electrode
4613 . . . Third Upper Electrode
462 . . . Lower Electrode
561 . . . Upper Electrode
5611 . . . First Upper Electrode
5612 . . . Second Upper Electrode
5613 . . . Third Upper Electrode
5614 . . . Fourth Upper Electrode
571 . . . First Current Supply Area
572 . . . Second Current Supply Area
581 . . . First Light-Amplifying Area
582 . . . Second Light-Amplifying Area
621A . . . First Plate Member
622A . . . Second Plate Member
621B, 622B, 721B, 722B . . . Rod-Shaped Air Hole
622C, 721C . . . Defect of Rod-Shaped Air Hole

The invention claimed is:

1. A photonic crystal laser comprising:

an active layer for generating light of a predetermined wave number range upon an injection of an electric current;

a first photonic crystal layer for forming a standing wave of light within the first photonic crystal layer having a first wave number within the predetermined wave number range, among the light generated in the active layer; and a second photonic crystal layer for forming a standing wave of light within the second photonic crystal layer having a second wave number within the predetermined wave number range and different from the first wave number, among the light generated in the active layer, wherein the first photonic crystal layer is provided on one side of the active layer, and the second photonic crystal layer is provided on the other side of the active layer, and a spatial beat results from a superposition of the standing wave of light formed by the first photonic crystal layer and the standing wave of light formed by the second photonic crystal layer.

2. The photonic crystal laser according to claim 1, wherein the first photonic crystal layer has a periodic distribution of refractive index with a first period, while the second photonic crystal layer has a periodic distribution of refractive index with a second period that differs from the first period.

3. The photonic crystal laser according to claim 2, wherein each of the first and second photonic crystal layers is a two-dimensional photonic crystal including a plate member in which modified refractive index portions whose refractive index differs from that of the plate member are periodically arranged.

4. The photonic crystal laser according to claim 3, wherein:
the modified refractive index portions in the first photonic crystal layer are arranged on lattice points of an orthogonal lattice or triangular lattice; and
the modified refractive index portions in the second photonic crystal layer are arranged on a same type of lattice as the modified refractive index portions in the first photonic crystal layer.

5. The photonic crystal laser according to claim 4, wherein the first and second photonic crystal layers are configured so that one of these two layers has its modified refractive index portions arranged in a square lattice pattern while the other layer has its modified refractive index portions arranged in a rectangular lattice pattern, the period of this rectangular lattice in a first direction being equal to the period of the square lattice, and the period of the same rectangular lattice in a second direction perpendicular to the first direction being different from the period of the square lattice.

6. The photonic crystal laser according to claim 2, wherein:
the first photonic crystal layer is a first plate member defined by an X-Y plane and having a first rod group formed by rods having a refractive index different from that of the first plate member, the rods being embedded in the first plate member in a pattern parallel to each other in a first direction and parallel to the X-Y plane;
the second photonic crystal layer is a second plate member defined by the X-Y plane and having a second rod group formed by rods having a refractive index different from that of the second plate member, the rods being embedded in the second plate member in a pattern parallel to each other in a second direction and parallel to the X-Y plane, and perpendicular to the rods of the first rod group; and
at least either the first or second rod group has a defect created in a periodic structure thereof.

7. The photonic crystal laser according to claim 2 wherein:
a current injection means for injecting the electric current into only a portion of the active layer is provided, an injection point thereof being controllable; and
the second period of the second photonic crystal layer changes according to a position within the same layer.

8. The photonic crystal laser according to claim 7, wherein:
the second photonic crystal layer has a plurality of modified period areas having different second periods; and
the current injection means includes a pair of electrodes between which the active layer, the first photonic crystal layer and the second photonic crystal layer are sandwiched, one of the two electrodes being divided into a plurality of electrode segments for each of the modified period areas.

9. The photonic crystal laser according to claim 8, wherein the modified period areas are arranged in a rectangular lattice pattern with lattice points arrayed in two directions intersecting each other in the rectangular lattice, in which a lattice-point interval in one direction varies from one modified period area to another.

10. The photonic crystal laser according to claim 8, wherein the modified period areas are arranged in a rectangular lattice pattern with lattice points arrayed in two directions intersecting each other in the rectangular lattice, in which lattice-point intervals in both directions vary from one modified period area to another.

11. The photonic crystal laser according to claim 7, wherein the second period continuously varies within the second photonic crystal layer.

12. The photonic crystal laser according to claim 11, wherein the current injection means includes a pair of electrodes between which the active layer, the first photonic crystal layer and the second photonic crystal layer are sandwiched, one of the two electrodes being divided into a plurality of electrode segments.

13. The photonic crystal laser according to claim 11, wherein the modified period areas are arranged in a rectangular lattice pattern with lattice points arrayed in two directions intersecting each other in the rectangular lattice, in which a lattice-point interval in one direction varies from one modified period area to another.

14. The photonic crystal laser according to claim 11, wherein the modified period areas are arranged in a rectangular lattice pattern with lattice points arrayed in two directions intersecting each other in the rectangular lattice, in which lattice-point intervals in both directions vary from one modified period area to another.

* * * * *